(12) United States Patent
Miller et al.

(10) Patent No.: US 8,136,961 B2
(45) Date of Patent: Mar. 20, 2012

(54) ELECTRO-LUMINESCENT AREA ILLUMINATION DEVICE

(75) Inventors: Michael E. Miller, Honeoye Falls, NY (US); Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 607 days.

(21) Appl. No.: 11/946,138

(22) Filed: Nov. 28, 2007

(65) Prior Publication Data
US 2009/0135582 A1    May 28, 2009

(51) Int. Cl.
*F21V 13/00* (2006.01)
(52) U.S. Cl. ............ 362/242; 362/236; 362/84
(58) Field of Classification Search ............ 362/242, 362/236, 243, 84
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | Van Slyke et al. | |
| 6,366,017 B1 * | 4/2002 | Antoniadis et al. | 313/506 |
| 6,773,139 B2 * | 8/2004 | Sommers | 362/237 |
| 6,776,496 B2 | 8/2004 | Cok | |
| 6,952,311 B2 | 10/2005 | Sakai | |
| 6,984,934 B2 | 1/2006 | Möller et al. | |
| 7,053,547 B2 | 5/2006 | Lu et al. | |
| 7,284,871 B2 * | 10/2007 | Oon et al. | 362/17 |
| 7,461,948 B2 * | 12/2008 | van Voorst Vader et al. | 362/244 |
| 2007/0091037 A1 | 4/2007 | Lee | |
| 2009/0279295 A1 * | 11/2009 | Van Der Poel | 362/235 |

FOREIGN PATENT DOCUMENTS
WO    WO 2008007297 A2 *   1/2008

* cited by examiner

*Primary Examiner* — Robert May
(74) *Attorney, Agent, or Firm* — Morgan, Lewis & Bockius LLP

(57) ABSTRACT

An electro-luminescent area illumination device that includes two or more area emitters formed on a substrate. Each of the two or more area emitters emit light having different area illumination profiles.

20 Claims, 10 Drawing Sheets

ELECTRO-LUMINESCENT AREA ILLUMINATION DEVICE

FIELD OF THE INVENTION

The present invention relates to electro-luminescent lighting devices. In particular, the present invention provides an electro-luminescent lighting device formed on a single substrate and capable of simultaneously providing both a large area illumination source and a directed task light.

BACKGROUND OF THE INVENTION

Coated electro-luminescent devices, for example electro-luminescent devices employing coated organic light emitting diode materials as discussed by U.S. Pat. No. 4,769,292, issued Sep. 6, 1988 to Tang et al., and U.S. Pat. No. 5,061,569, issued Oct. 29, 1991 to VanSlyke et al, have been discussed for creating large, diffuse lights for providing general illumination. Cok in U.S. Pat. No. 6,776,496, entitled "Area illumination lighting apparatus having OLED planar light source", discusses one example of such a lighting device. Since these devices are among the only luminance sources known that can be manufactured by coating large substrates with materials that may be electrically energized to produce large, uniform lamps, they hold significant promise for producing large illumination sources that can provide diffuse illumination from a large area source, providing relatively even illumination for large rooms. This ability to create large diffuse illumination sources is considered one of the primary advantages offered by this technology, although they have other advantages, such as high efficiency.

Such lamps can provide diffuse, relatively even illumination over large environments. While it is often the case that users require a relatively low level of illumination within their general environment to allow them to navigate a space and to create a generally desirable environment, users often require a higher level of illumination to perform detailed tasks, such as reading. Therefore, multiple lighting sources are often used in many environments, including light sources that provide large area environmental lighting and additional light sources that provide higher levels of task illumination. It is true that the luminance of the large area illumination sources could be increased to provide a high level of luminance across the entire environment to facilitate a task, such as reading, however this would result in unnecessarily high illumination levels across a very large proportion of the environment and will likely result in significantly large amounts of wasted energy.

It is known in the field of electronic displays to provide directed light output. For example, Lee in US Publication 2007/0091037, entitled, "Energy Efficient Compact Display for Mobile Device" discusses an electronic display coupled with an array of micro-lenses, wherein a relatively large array of addressable light-emitting elements are located beneath each micro-lens. Within this display system, the light is directed to one or more locations in space by selecting one or more of the light-emitting elements within the array of light-emitting elements. As such, the light provided by the display may be directed to a small proportion of the 180-degree hemisphere in front of the display. One of the primary advantages of such a design when employed with an electro-luminescent display is that only the active light-emitting elements consume power and therefore, such an arrangement can be used to direct light to the user. Therefore, the arrangement provided by Lee, who also discusses tracking the user's movements, allows the user to perceive that the display emits light in all directions even though only enough light is generated to provide this level of illumination within a small proportion of the 180-degree sphere in front of the display. Unfortunately, such a design does not simultaneously provide both a uniform illumination across a large environment and a task light. Further, the ability to address a very large number of light-emitting elements with different signals to create such a display device will typically require complex drive circuitry, typically including active matrix drive backplanes. Unfortunately, such backplanes are not applicable to general-purpose lighting devices due to the high cost of such backplanes with respect to the selling price of such general-purpose lighting devices.

It is also known to employ micro-lenses to improve light extraction from thin film electro-luminescent display devices, such as OLEDs. For instance Moller in U.S. Pat. No. 6,984,934 entitled "Micro-lens array for display intensity enhancement" and Lu in U.S. Pat. No. 7,053,547 entitled "Increased emission efficiency in organic light-emitting devices on high-index substrates" discuss placing lens arrays over a device having a small-molecule organic emissive layer to increase the light extraction efficiency of the device. However, these lens arrays are not used to direct the light but only to diffract the light to more efficiently couple light out of a high index material into air. Therefore, it is important that these lenses be placed in direct contact with high index materials that are in direct contact with the light-emissive layer, which precludes the use of these lenses to direct the light to defined locations in space.

It should be noted that since the lens arrays for providing light diffraction to aid light extraction from a high index electro-luminescent device does not direct the light but simply diffract the light, the shapes of the lenses are not particularly important. In fact, this function may be performed to some degree by creating any diffraction pattern, which redirects the light. Therefore relatively simple manufacture of such lens arrays have been discussed by others techniques, which do not precisely control the tolerances on the lens shape. One such method has been discussed by Sakai in U.S. Pat. No. 6,952,311, entitled "Microlens device and method of manufacturing the same, electro-optic device and electronic apparatus". Note that this method requires only the ejection of droplets onto a substrate, followed by a curing step and that any changes in surface properties between neighboring drop sites will significantly affect the drop shape. Therefore, the methods used to create such microlens arrays will not be applicable to the formation of microlens arrays that can be used to direct light from the source to a defined location in space as would be required to provide the function as described in US Publication 2007/0091037.

There is, therefore, a need to provide a general-purpose light source that can provide both large area illumination and simultaneously provide task lighting into a more localized area. Such a device must be provided with low cost to make it applicable to the general-purpose lighting market.

SUMMARY OF THE INVENTION

The need has been addressed by providing an electro-luminescent area illumination device that includes a substrate, and two or more area emitters formed on the substrate. Each of the two or more area emitters emit light having different area illumination profiles.

Another aspect of the present invention provides an electro-luminescent area illumination device that includes a first electro-luminescent area emitter formed on a substrate in correspondence with first optical elements. A typical first optical element directs emitted light from the first electroluminescent area emitter to shape a first illumination profile. Additionally, a second electroluminescent area emitter is also formed on the substrate and has a second illumination profile different from the first illumination profile.

A third aspect of the present invention provides a method for forming an electro-luminescent area illumination device, comprising the steps of:

a) forming two or more area emitters on a substrate; and b) spatially configuring different area illumination profiles for emitted light from each of the two or more area emitters.

A fourth aspect of the present invention provides a system for illuminating an environment that includes an electro-luminescent area illumination device, comprising:

a) a substrate;

b) two or more area emitters formed on the substrate, wherein each of the two or more area emitters emit light having different area illumination profiles; and c) a controller for controlling the direction, illumination level or color of at least one of the two or more area emitters to provide both a directed, narrow angle illumination and a wide angle illumination.

DETAILED DESCRIPTION OF THE INVENTION

Figure 1:
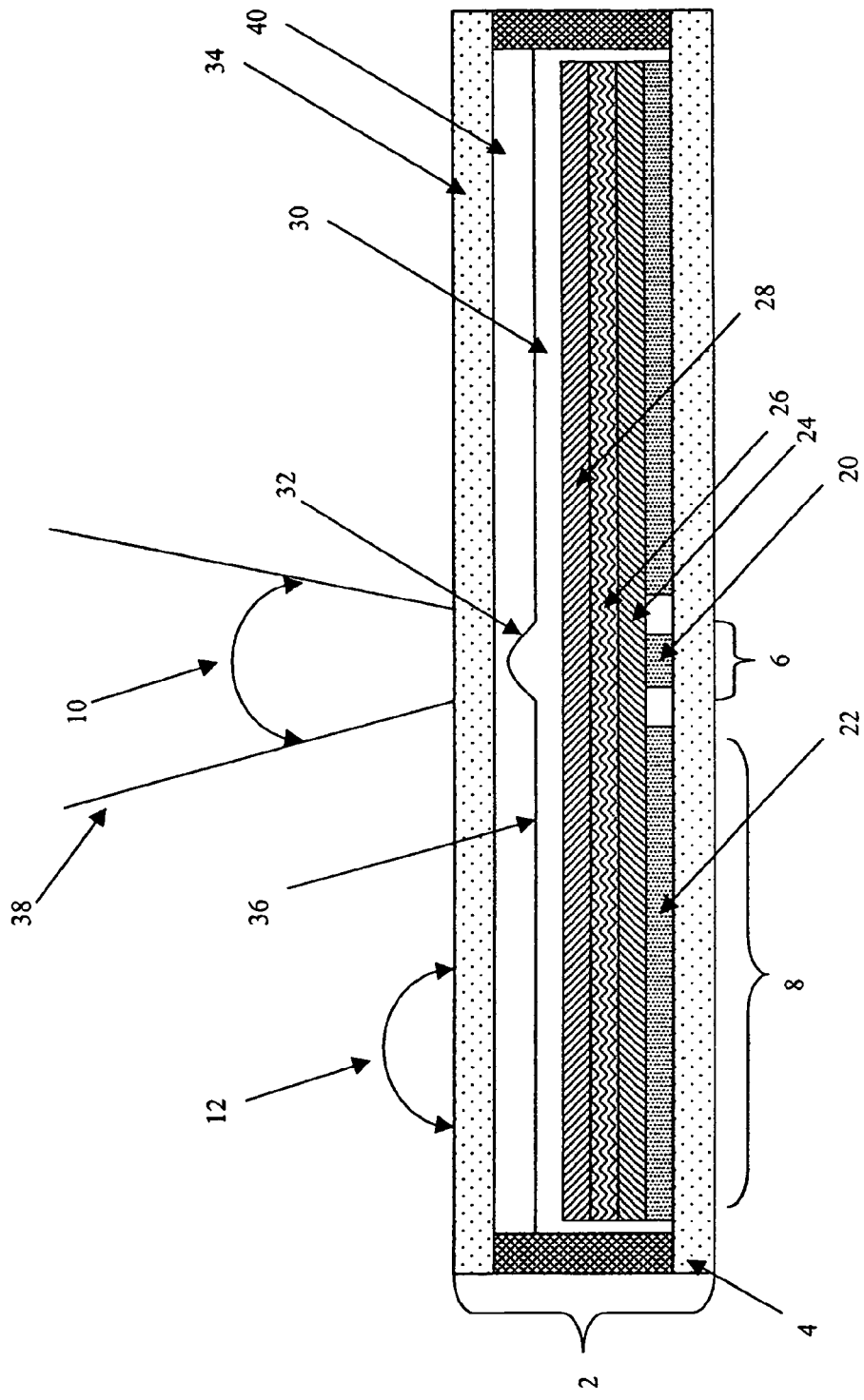
FIG. 1 is a cross-sectional diagram of an electro-luminescent area illumination device according to an embodiment of the present invention.

The need is met by providing an electro-luminescent area illumination device, such as shown in FIG. 1. As shown, this electro-luminescent area illumination device 2 includes a substrate 4 and two or more electro-luminescent area emitters 6, 8, which are formed on the substrate 4. These two or more electro-luminescent area emitters 6, 8 emit light having different area illumination profiles. The illumination profiles will typically differ by the cone angle over which light is emitted or the direction, defined by the center of the cone angle, in which the light is emitted. As shown in FIG. 1, desirable embodiments of the present invention can have different area illumination profiles and can comprise different cone angles 10, 12 and specifically can comprise cone angles for directing narrow-beam and wide-beam illumination, respectively. As shown in this figure, the cone angle 10 is approximately 30 degrees and the cone angle 12 is 180 degrees.

One application of the present invention is an electro-luminescent lamp which provides a narrow-beam illumination, i.e., a narrow cone angle 10, that provides a task light for the user of the lamp, while the same lamp also provides an environmental illumination source wherein at least one of the electro-luminescent area emitters 8 provides a wide-beam illumination, i.e., a wide cone angle 12, to provide uniform illumination over a surface or within an environment by emitting light over a very wide beam with a cone angle that approaches 180 degrees. This lamp relies upon one of the electro-luminescent area emitters 8 to provide a general-purpose lamp for providing relatively uniform illumination within an environment while another electro-luminescent area emitter 6 provides the task light; therefore, the functions of both types of lamps are integrated into a single device. Further, because different electro-luminescent area emitters 6, 8 provide these functions, these two or more of the electro-luminescent area emitters 6, 8 can be operated simultaneously. The simultaneous operation of these electro-luminescent area emitters 6, 8 within the same electro-luminescent area illumination device 2, enables both a task lamp and a general-purpose lamp to be provided simultaneously by the same device. As shown in some embodiments, the direction or the cone angles 10, 12 are adjustable by the user to allow the user to customize the lighting profiles within their environment.

In another desirable embodiment, two or more of the electro-luminescent area emitters 6, 8 can be commonly controlled. That is they may receive the same activation or deactivation signal or they may be provided current or voltage from the same circuit such that they are both driven by the same current to allow them to provide approximately the same level of illumination. In some embodiments, the electro-luminescent area emitters 6, 8 may be designed to provide different intensity or color of illumination by simply activating different electro-luminescent area emitters within the electro-luminescent area emitters 6, 8.

It is not required, however, that electro-luminescent area emitters 6, 8 receive the same current. Instead, the current or voltage can be controlled independently to allow the two or more electro-luminescent area emitters 6, 8 to be independently controlled. Further, multiple colors of electro-luminescent area emitters can provide light having each of the cone angles 10, 12. By independently controlling the current or voltage to luminescent area emitters 6, 8 having the same color, the intensity of the two or more electro-luminescent area emitters may be changed to provide different illumination values. By independently controlling the current or voltage of electro-luminescent area emitters when the emitters provide a different color of illumination, the color of the two or more electro-luminescent area emitters 6, 8 can be manipulated to provide different illumination colors.

As noted earlier, the present invention provides an electro-luminescent area illumination device 2 that includes a substrate 4 and at least two electro-luminescent area emitters 6, 8 are formed on the substrate 4. These electro-luminescent area emitters 6, 8 emit light having different area illumination profiles. FIG. 1 provides one particular embodiment of the present invention. As shown, the first electro-luminescent area emitter 6 will typically be formed from a first electrode segment 20, which is formed on the substrate 4. An electro-luminescent layer 24 is formed over the first electrode segment 20 and a second electrode 26 is formed over the electro-luminescent layer 24. An optional encapsulation or protection layer 28 is formed over the cathode to protect the device from damage during assembly.

A first optical element 32 is aligned with the first electro-luminescent area emitter 6 to shape a first illumination profile 38 by directing the emitted light from the first electro-luminescent area emitter 6. As shown in FIG. 1, the first optical element 32 can be a lens. However, this first optical element 32 can be an array of lenses, or a reflective structure. The electro-luminescent layer 24 will typically provide nearly Lambertian emission and the first electrode segment 20 will typically be highly reflective, while the second electrode 26 is either transparent or semi-transparent. As such, the first electro-luminescent area emitter 6 will often provide nearly uniform illumination over a hemisphere centered perpendicularly to the substrate 4. In such a device, the first optical element 32 will typically reduce the cone angle of the illumination. Depending upon the alignment of the first optical element 32 with the electro-luminescent area emitter 6 this first optical element 32 also changes the direction of illumination. For example, by aligning the center of the first optical element 32 such that the first electro-luminescent area emitter 6 fills only a portion of the lens area that serves as the first optical element 32, the light is directed in a direction other than perpendicular to substrate 4 to provide an alternative area illumination profile. While it is typical that the first electro-luminescent area emitter 6 will emit light over a large cone angle of illumination, which will be reduced by the first optical element 32, it is also possible to construct the first electro-luminescent area emitter 6 to emit light over a relatively small cone angle. The first optical element 32 may then either further reduce or increase the cone angle of the light emitted by the first electro-luminescent area emitter 6.

A second electro-luminescent area emitter 8 is also formed on the same substrate 4. This second electro-luminescent area emitter 8 will typically include a second electrode segment 22 on the substrate. Either a different or the same electro-luminescent layer 24 can be formed over this electrode segment 22, followed by a second electrode 26. This second electrode segment 26 may be shared with the first electro-luminescent area emitter 6 as shown in FIG. 1 or may be patterned to form a separate electrode segment. If the first 6 and second 8 electro-luminescent area emitters are to be controlled independently of one another, at least one of the electrode segments for these two electro-luminescent area emitters must be segmented to provide separate electrode segments, otherwise the first 6 and second 8 electro-luminescent area emitters can share electrically common electrode segments. Typically, though, at least one of the electrode layers will be divided into electrode segments 20, 22 to provide the flexibility to control the first 6 and second 8 electro-luminescent area emitters independently of one another.

Within the present invention, the second electro-luminescent area emitter 8 will have a second illumination profile different from the first illumination profile, for example, as indicated by having a larger cone angle 12 than the cone angle 10 of the first electro-luminescent area 6. As shown in FIG. 1, a flat surface 36 can be aligned with the second electro-luminescent area emitter 8 to allow light to be emitted by the device, which will typically have a large cone angle that is nearly a hemisphere centered about a vector perpendicular to the substrate, to be emitted from the overall device without modification. As such, the illumination profile provided by this second electro-luminescent area emitter 8 will have a larger cone angle 12 than the cone angle 10 of the first electro-luminescent area emitter 6.

Figure 2:
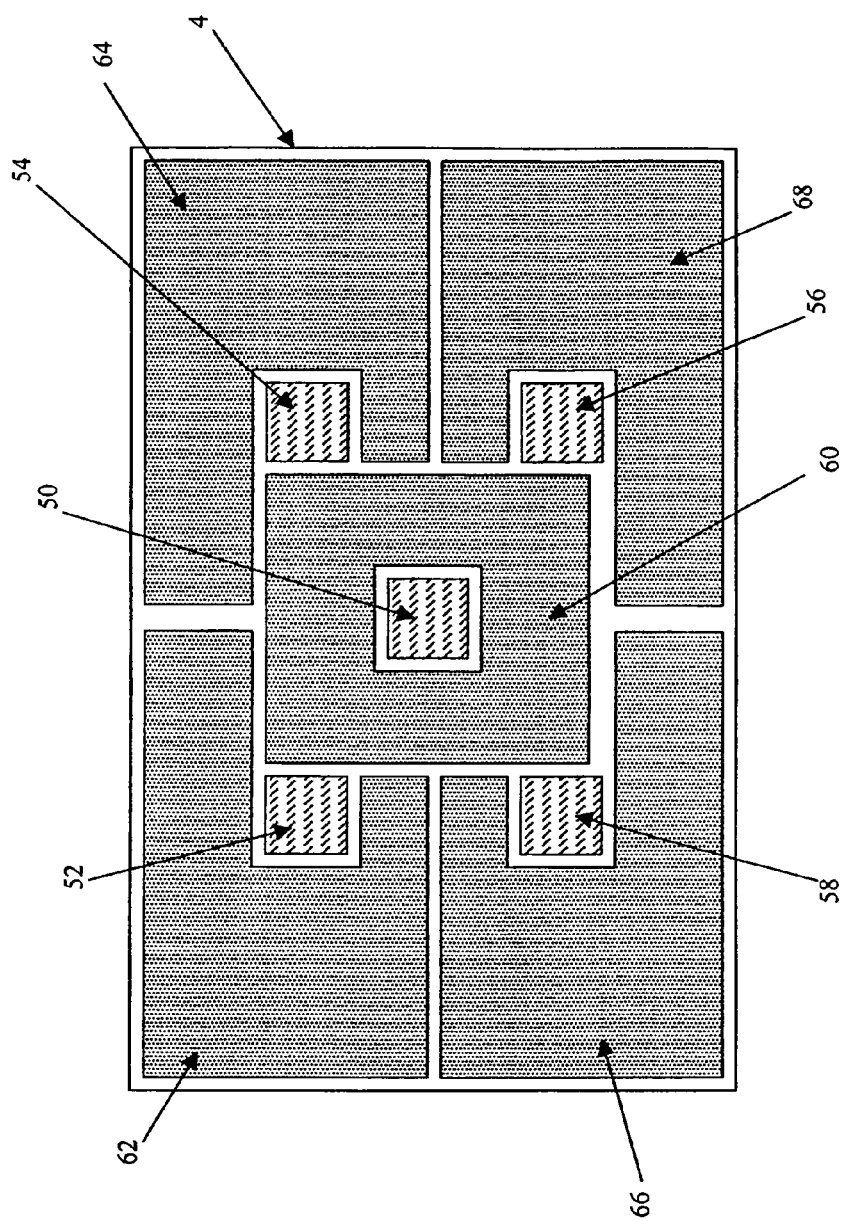
FIG. 2 is a plan view of an electro-luminescent area illumination device having first electro-luminescent area emitters dispersed among second electro-luminescent area emitters according to an embodiment of the present invention.

As shown in FIG. 1, the first optical element 32 is formed on a second substrate 34, which is different from substrate 4 on which the first electro-luminescent area emitter 6 is formed. To allow the light to be directed appropriately, a low-index gap 30 can be present. That is, a gap having a low optical index can be formed. Specifically the gap has a lower optical index than the second substrate 34 or the electro-luminescent layer 24. As shown in FIG. 2, this low-index gap 30 may be formed of air or an inert gas between the two substrates 4, 34. Depositing relatively transparent polymeric or other low-index materials between the substrates can also create this low-index gap. In desirable embodiments the thickness of this gap is selected such that the electro-luminescent layer 24 is placed at the focal distance of the lens 32. Also, in desirable embodiments, the size of the lens, as measured at its widest point, will be larger than the first electro-luminescent area emitter 6 to allow as large a percentage of the light generated by the electro-luminescent area emitter 6 as possible to be collected by and directed by first optical element 32. It should be noted that the first optical element 32 could be formed of the same material as the second substrate 34. However, it is more likely that first optical element 32 will be formed as a polymer in a separate optical layer 40 on the substrate 34. This polymer may be coated onto the substrate and shaped to form optical elements either before or after being polymerized, for example, by stamping or molding.

Although FIG. 1 shows primarily a first electro-luminescent area emitter 6 and a second electro-luminescent emitter 8, the device may have a large number of electro-luminescent area emitters and these electro-luminescent area emitters may be arranged in any of numerous arrangements on the substrate. For example, as shown in FIG. 2, the two or more electro-luminescent area emitters include narrow-angle and wide-angle electro-luminescent area emitters, including first electro-luminescent area emitters 50, 52, 54, 56 and 58 for providing narrow-angle emitters having narrow cone angles. These first electro-luminescent area emitters are located between the second electro-luminescent area emitters 60, 62, 64, 68, 70 for providing wide-angle emitters having wide cone angles. Although the first electro-luminescent area emitters 50, 52, 54, 56, and 58 may all have the same alignment with first optical elements 32 (not shown), they may alternatively all have different alignments to direct the light to the same point in space.

Note that the first electro-luminescent area emitters 50, 52, 54, 56, and 58 typically applied in conjunction with optical elements, are shown as, and will typically be smaller in area than, the second electro-luminescent area emitters 60, 62, 64, 66, and 68. This size relationship allows the second electro-luminescent area emitters 60, 62, 64, 66, and 68 to provide a diffuse illumination source with very small, if any gaps in illumination. However, the relatively small size of the first electro-luminescent area emitters, allows the light to be directed by applying relatively small optical elements, while utilizing a very small low-index gap between the materials from which the optical elements are formed 40 on the top layer of the electro-luminescent device 28. In many embodiments herein the present invention has a first electro-luminescent area emitter 6, which provides a relatively narrow cone angle 10, the cone angle 10 will be less than 45 degrees. The first electro-luminescent area emitters 50, 52, 54, 56, and 58 will typically each have a minimum dimension that is less than 0.5 cm and fill an area that is less than 20% of the total area of the substrate 4. The low-index gap will typically be less than 0.5 cm and will more preferably be less than 0.1 cm. Conversely, the total area consumed by the second electro-luminescent area emitters 60, 62, 64, 66, and 68 within this embodiment will typically fill an area that is 70% or greater of the total area of the substrate 4 and may have a minimum dimension that is significantly larger than 0.5 cm.

Such an electro-luminescent area illumination device can be produced by forming two or more area emitters on a substrate; and spatially configuring different area illumination profiles for emitted light from each of the two or more area emitters sharing a substrate. The specific embodiment shown in FIG. 1 can be constructed by forming two or more electro-luminescent area emitters on a first substrate; forming optical elements on a second substrate; aligning the optical elements with the area emitters to spatially configure the different area illumination profiles and fixing the relative position of the two substrates to maintain alignment and ideally the proper size of low-index gap. Other embodiments may include forming reflective elements on a first substrate and then forming area emitters over these reflective elements in an aligned fashion to spatially configure the different illumination profiles. While the embodiment of FIG. 1 illustrates a top-emitting structure in which light is emitted through a top substrate (e.g. a cover) and the electrode 26 is transparent, in other embodiments light is emitted through a transparent substrate and the electrodes 22, 20 are transparent to form a bottom-emitting structure. In such a bottom-emitting structure, the optical elements 32 can be formed on a side of the substrate 4 opposite the transparent electrodes 20, 22. Further, the optical elements 32 and the electro-luminescent area emitters can share a common substrate or be formed on separate substrates and attached.

Figure 3:
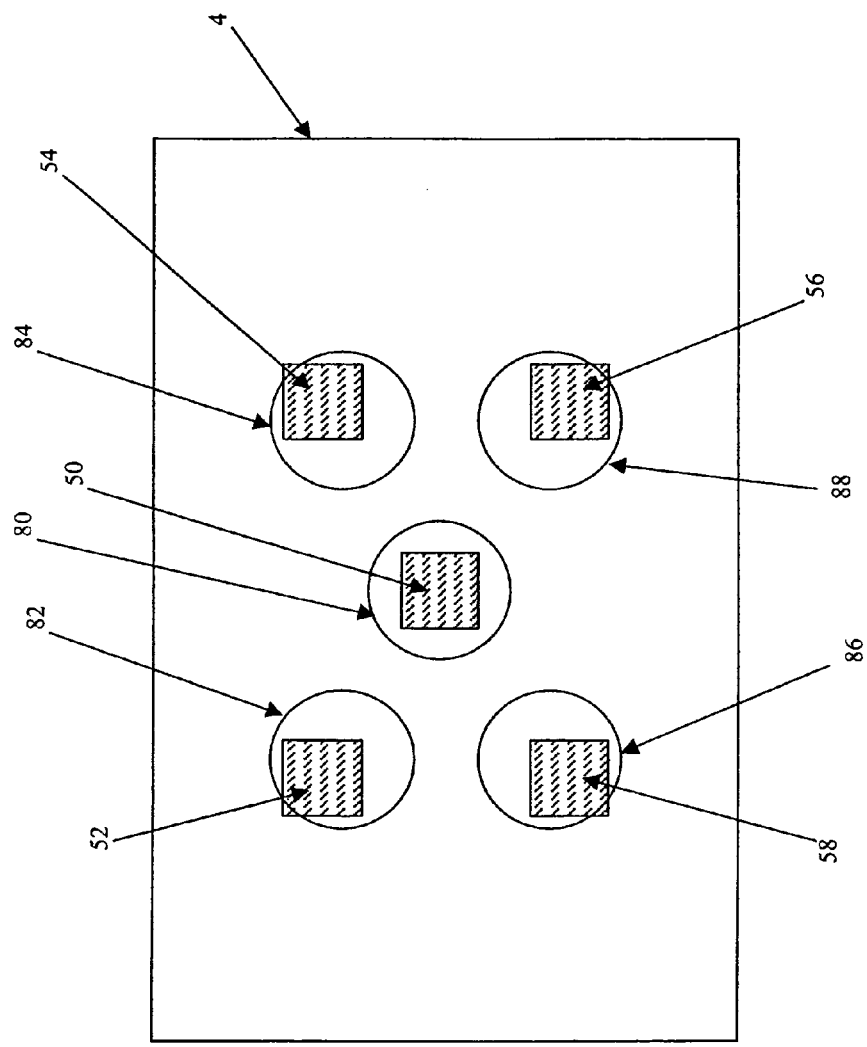
FIG. 3 is an illustrates first optical elements aligned with respect to first electro-luminescent area emitters to create a task light according to one embodiment of the present invention.

FIG. 3 shows detail views of the first electro-luminescent area emitters 50, 52, 54, 56, and 58 with lens elements 80, 82, 84, 86, and 88 formed on substrate 4. Note that the lens element 80 and the first electro-luminescent area emitter 50 are arranged such that the first electro-luminescent area emitter 50 is centered in the lens 80, allowing the light to be directed perpendicularly to the substrate 4. Each of the other first electro-luminescent area emitters 52, 54, 56, and 58 are offset towards one of the diagonal corners of the lens elements 82, 84, 86, and 88. When offset as shown in this figure, the light from each of the first electro-luminescent area emitters is directed along vectors that are not perpendicular to the substrate, but are directed along vectors that are angled towards the location of the center first electro-luminescent area emitter 50. As such, all of the first electro-luminescent area emitters can be directed at a single point or smaller area in space to concentrate the light into a relatively small area and provide a concentrated light source for a task light. The offset of the first electro-luminescent area emitters from the center of the lens elements is designed to direct the light within a defined area when the electro-luminescent area emitter device is located a defined distance from a work surface.

Figure 4:
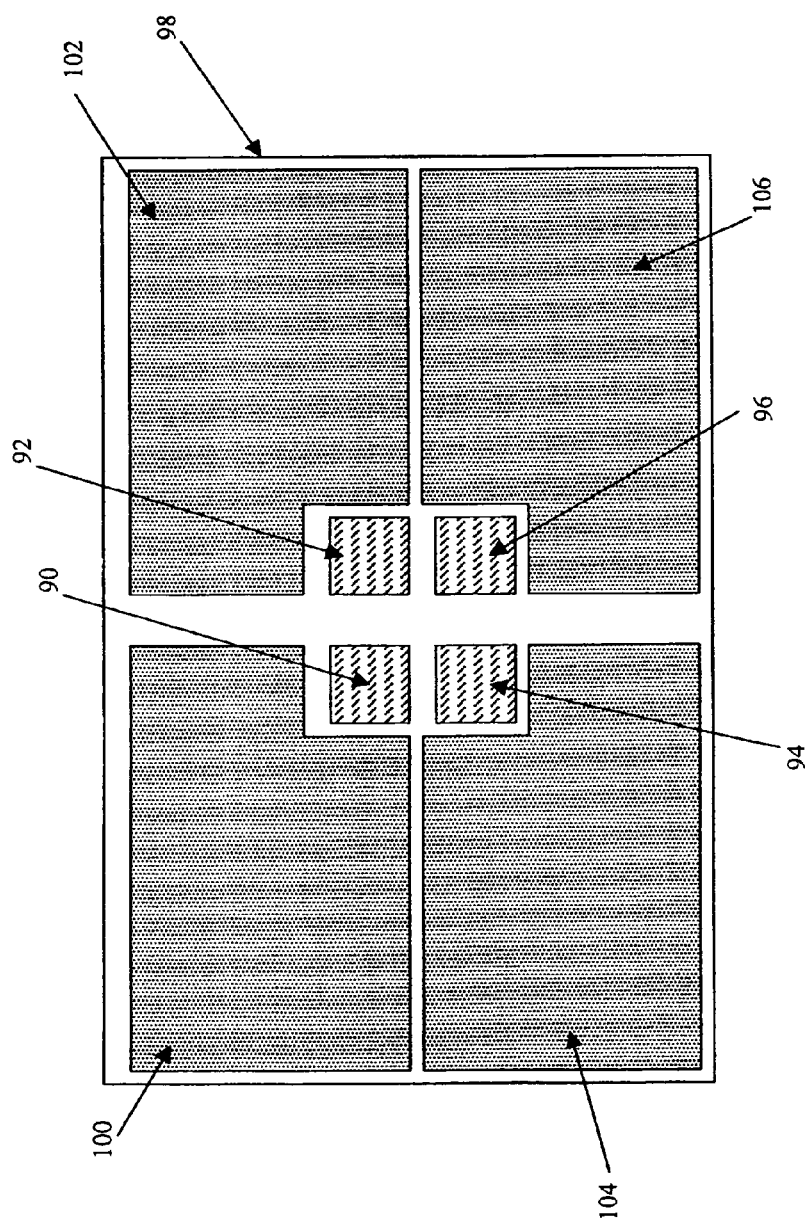
FIG. 4 is a plan view of an electro-luminescent area illumination device having first electro-luminescent area emitters clustered in the center of a device according to an embodiment of the present invention.

It is not necessary, however, that the first electro-luminescent area emitters 50, 52, 54, 56, and 58 be distributed over the substrate 4. Instead, the first electro-luminescent area emitters 50, 52, 54, 56, and 58 can be localized within one area of the substrate as shown in FIG. 4. As shown in this figure, the first electro-luminescent area emitters 90, 92, 94, and 96 are localized in one area of the substrate 98, for example, the center of the substrate 98. Second electro-luminescent area emitters, for example 100, 102, 104, and 106 may be located around the first electro-luminescent area emitters 90, 92, 94, and 96. Lenses can be used to direct the light from these first electro-luminescent area emitters 90, 92, 94, and 96 to a point or small area in space to provide a task light. Note that the small area may be larger than the area over which the electro-luminescent emitters are located. In various alternative embodiments of the present invention, a single optical element can be provided for multiple electro-luminescent area emitters or, alternatively, multiple optical elements can be provided for single electro-luminescent area emitters.

The electro-luminescent area illumination device may further include second optical elements that direct light emitted from the second electro-luminescent area emitter to shape the second illumination profile differently from the first illumination profile. In such embodiments, the first and second optical elements will typically be designed to have different optical powers for providing both narrow and wide angles of illumination. For example, the surface 36 aligned with the second electro-luminescent area emitters 8 in FIG. 1 may be shaped to provide lens power, rather than being merely planar. However, these lenses will have different power than the first optical elements 32 such that the second electro-luminescent area emitters 8 can, for example, emit light over a cone angle 12 that is broader than the cone angle 10 of illumination provided by the first electro-luminescent area emitters 6.

Figure 5:
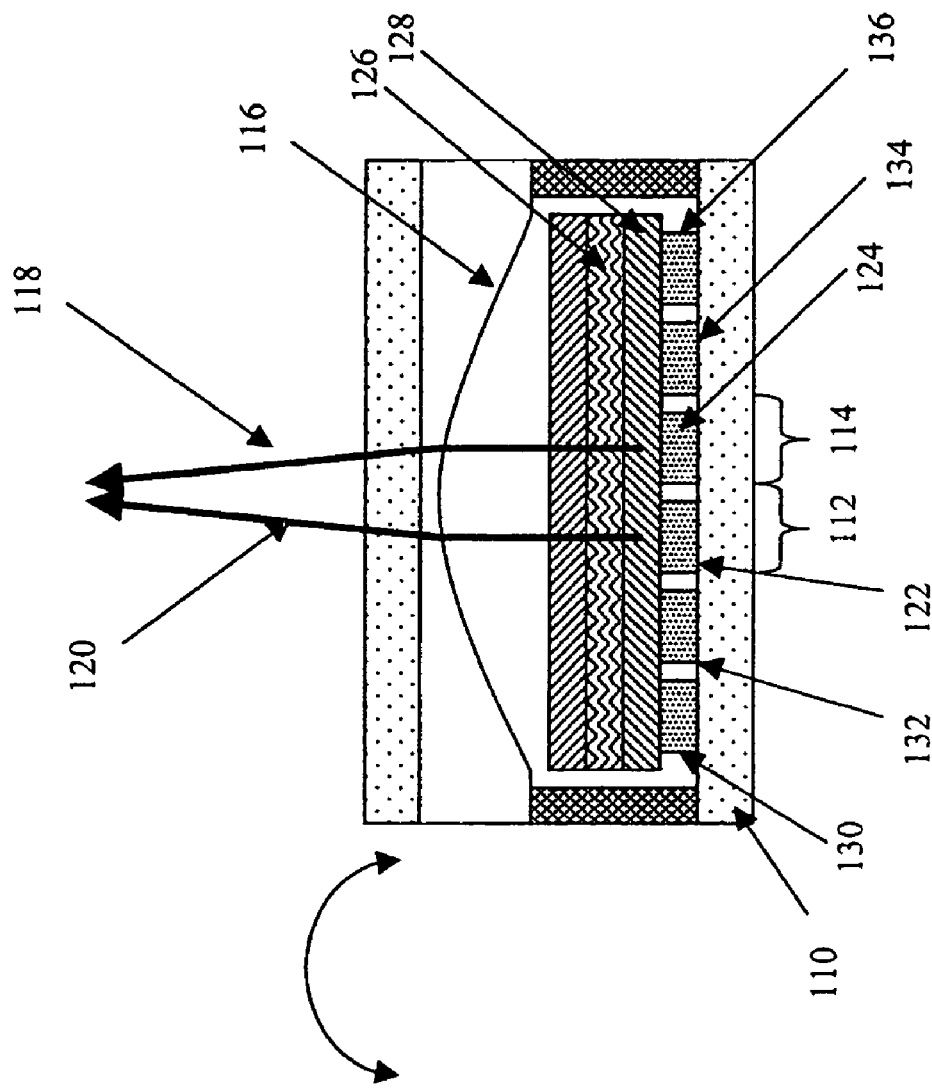
FIG. 5 is a cross-sectional view of a portion of an electro-luminescent area illumination device according to an embodiment of the present invention.

In other desirable embodiments herein, the first and second illumination profiles have equivalent cone angles, however, the direction of illumination provided by the first and second optical elements may be different. FIG. 5 shows a cross-section of a portion of an electro-luminescent area device according to one such embodiment in which the first 112 and second 114 electro-luminescent area emitters are formed on the same substrate 110. A first optical element, defined by the curved surface 116 directs emitted light from the first electro-luminescent area emitter 112 to shape a first illumination profile, including a first cone angle and a first direction 118. The curved surface 116 of the first optical element, however, also directs emitted light from the second electro-luminescent area emitter 114 to shape a second illumination profile. The second illumination profile will have a cone angle that is approximately equal to the cone angle of the first illumination profile. However, the second illumination profile will have a second direction 120 that is substantially different from the first direction 118. As shown in FIG. 5, the first 112 and second 114 electro-luminescent area emitters are formed from unique segments. As shown, these segments are defined by the bottom electrode segments 122 and 124, each of which functions together with another common electrode layer 126 to excite a different portion of a common electro-luminescent layer 128. Additional electro-luminescent area emitters can also be formed under the same substrate and have their illumination profiles modified by the curved surface 116 of the first optical element. Shown in FIG. 5 are third 130, fourth 132, fifth 134 and sixth 136 electrode segments for defining third, fourth, fifth and sixth electro-luminescent area emitters. Generally, the light from each of these electro-luminescent emitters will encounter portions of the curved surface 116 with different slopes and will, therefore, provide additional illumination profiles, each with a unique direction.

Figure 6:
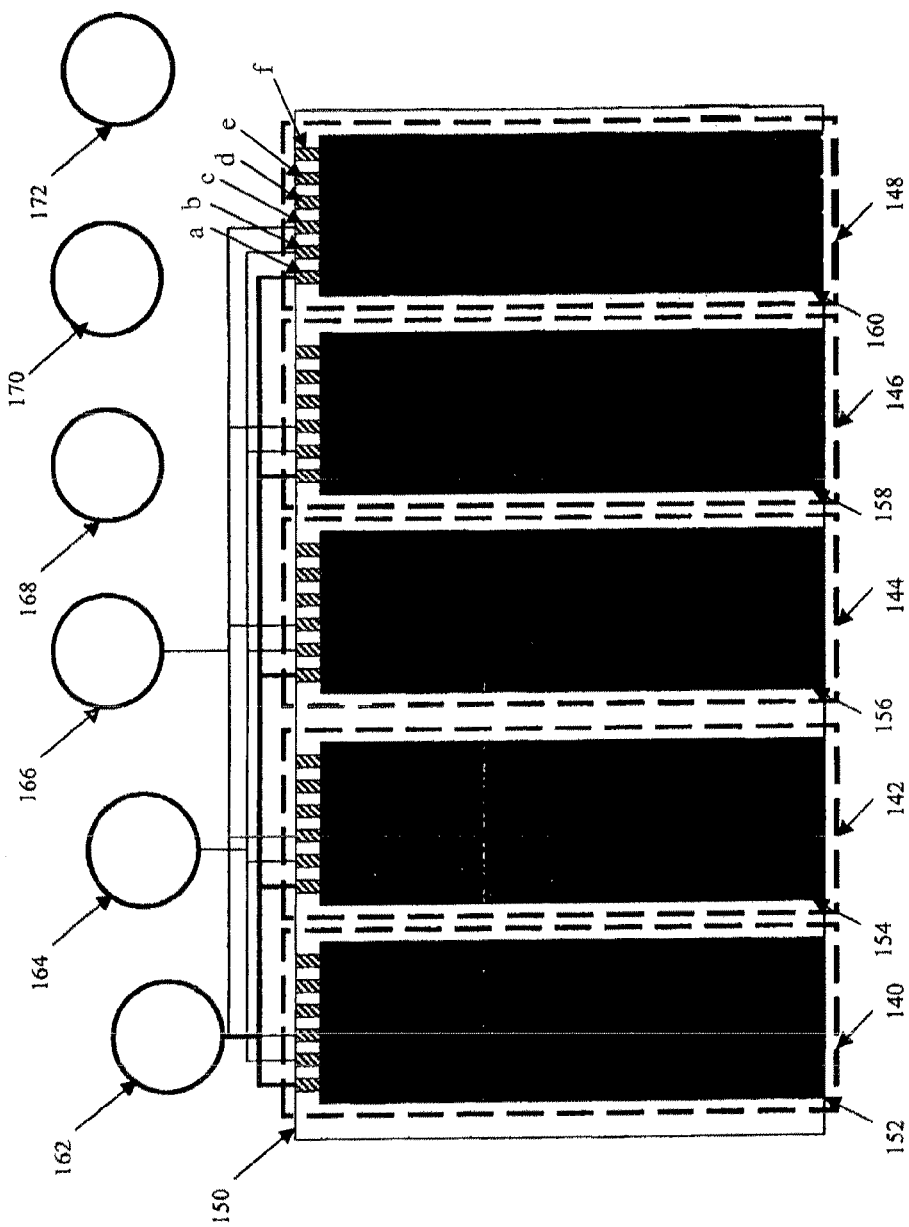
FIG. 6 is a plan view of an electro-luminescent area illumination device employing multiple portions of the area illumination device of FIG. 5.

FIG. 6 shows a top view of a larger portion of one embodiment of the electro-luminescent area device shown in FIG. 5. The portion 140 corresponds to the cross-sectional portion shown in FIG. 5. As shown, this portion is replicated across the electro-luminescent area device as portions 142, 144, 146, and 148. Shown in this figure, each portion contains a first optical element, specifically 152, 154, 156, 158, and 160 and six separate electrode segments a, b, c, d, e, and f are formed under each of the first optical elements. To simplify the drawing, these electrode segments will be denoted as 148*a*, 148*b*, 148c, 148d, 148e, and 148f. The electrode segments in the other portions will be denoted by the portion number followed by a letter, where the electrode segment nearest the left edge of the portion is a and these letters progress until f, which will be nearest the right edge of the portion. As shown in this figure, the first electro-luminescent area emitter 112 (of FIG. 5) comprises linear segments defined by electrode segment 140c and the first optical element 152 is a one-dimensional lens (e.g. a lenticule) or lens array for directing the emitted light in a narrow angle along one dimension. That is, the first optical element has optical power along the horizontal axis of the device shown in FIG. 6 but has no optical power along the vertical axis of the device shown in FIG. 6.

Electrical connections are formed at the edge of the substrate 150, forming common connections to each electrode having a common letter. For example, 140a, 142a, 144a, 146a, and 148a, all will be commonly connected to the same voltage or current supply 162. Similarly, electrodes 140b, 142b, 144b, 146b, and 148b will be commonly connected to the supply 164. Similarly, all electrodes indicated by c will be connected to supply 166, electrodes indicated by d will be connected to supply 168, electrodes indicated by e will be connected to supply 170 and electrodes indicated by f will be connected to supply 172. Note that the connections to power supplies 168, 170 and 172 are not shown explicitly in order to simplify the figure. As shown, the electro-luminescent area emitters formed under one optical element (e.g., 152) are independently controlled. Therefore, by modifying the voltage or current provided by power supply 162, 164, 166, 168, 170 or 172, the luminance output of each of the electro-luminescent area emitters defined by the segments a, b, c, d, e, and f are independently modulated.

Figure 7:
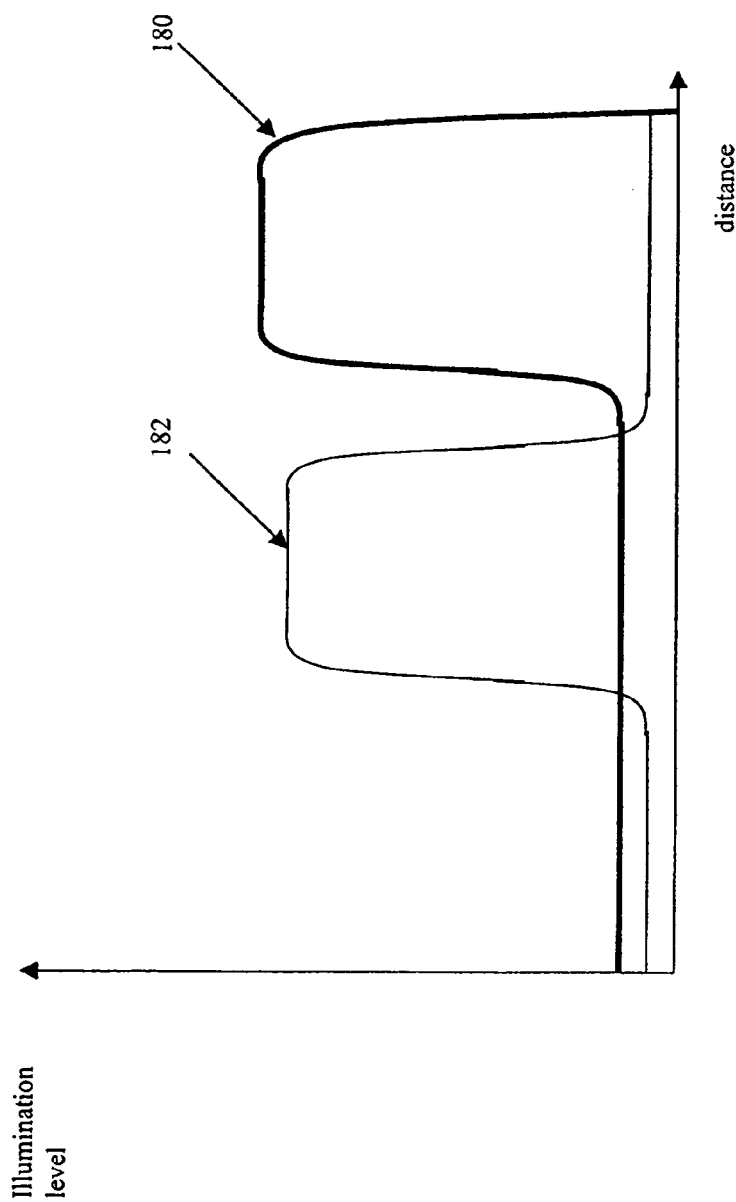
FIG. 7 is an illustration of some possible illumination profiles that may be created by the electro-luminescent area illumination device of FIG. 6.
Figure 8:
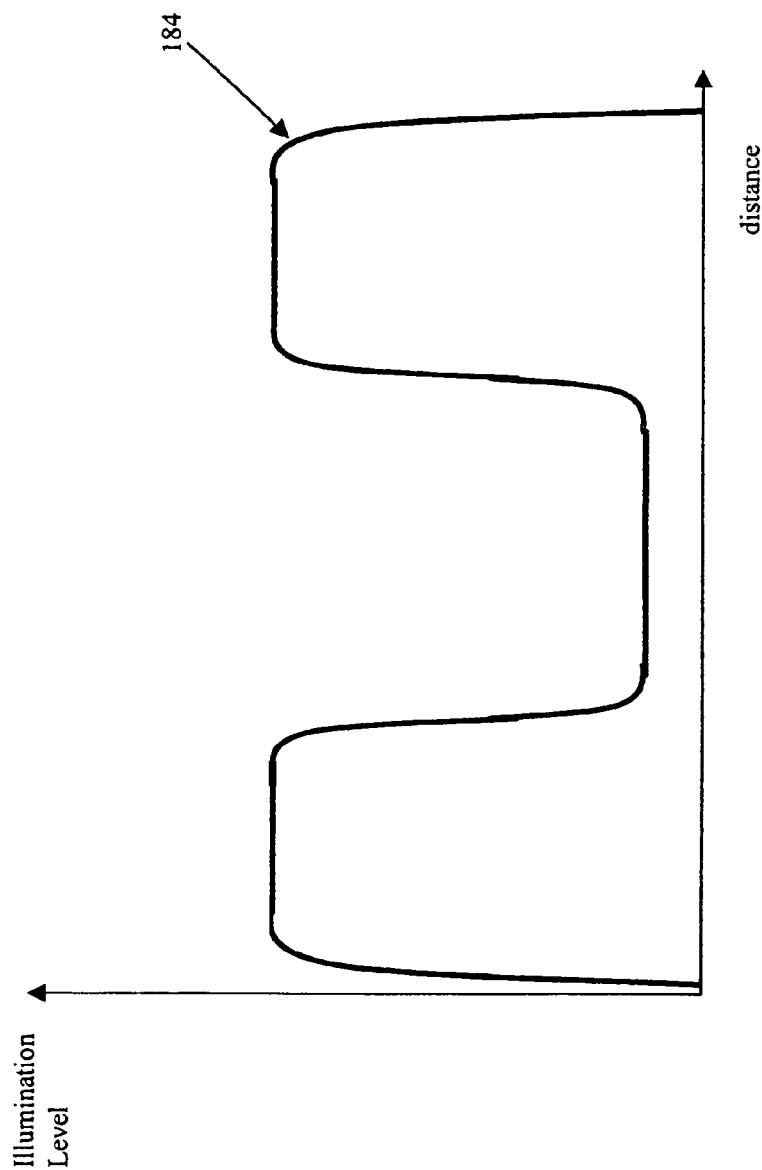
FIG. 8 is an illustration of an additional illumination profile that may be created by the electro-luminescent area illumination device of FIG. 6.

By controlling this electro-luminescent area device in this way, the luminance profile created by the entire electro-luminescent area device can be controlled. For example, by controlling the power supply 162 to provide a high voltage or current to electrodes a, and controlling the power supplies 164, 166, 168, and 170 to lower voltage or currents, the electro-luminescent area device illuminates an area with a luminance profile 180 perpendicular to the electrodes (as shown in FIG. 7). Notice that the luminance is higher towards the right of this luminance profile than across the remainder of the area. In another condition, the power supply 166 may be controlled to provide a higher voltage or current than power supplies 162, 164, 168, or 170, in which case a luminance profile such as 182 can be created. Alternatively, two of the current or voltage supplies can be controlled to provide a higher current or voltage to the electro-luminescent area device. For example, supplies 162 and 170 can both be controlled to provide a higher current or voltage than supplies 164, 166, or 168, thereby providing a luminance profile 184 in FIG. 8. Therefore, by controlling the relative current or voltage to multiple segments where the light output by these segments are modified by a common optical element independently, the user may be given significant control over the luminance profile created by the lamp. As this example illustrates, each of the segments a, b, c, d, e and f within the electro-luminescent area device provides multiple narrow angle illumination sources for illuminating different areas.

Figure 9:
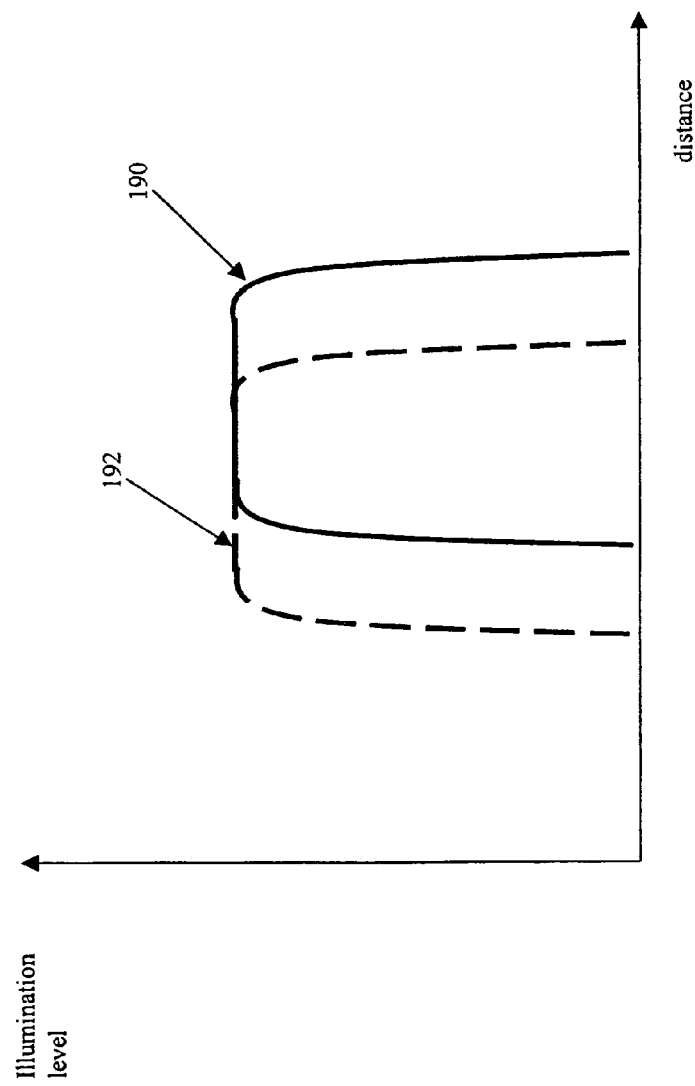
FIG. 9 is an illustration of a change in an illumination profile that may be created by the electro-luminescent area illumination device of FIG. 6.

Although, the previously described examples allowed illumination provided over an entire area typically illuminated by the electro-luminescent area device; this is not necessary. Instead, a high voltage or current provided to one power supply, for example, power supply 166, and much lower voltage or current may be provided to other power supplies connected to neighboring segments, e.g., power supplies 164 and 168. Accordingly, a luminance profile, such as profile 190 is created and shown in FIG. 9. The current or voltage may then be shifted to neighboring electrode segments. For example, by shifting current from 166 and 168 towards 164 and 166, the luminance profile can be shifted to the luminance profile 192. Note the power supplies control the change in the direction of the light. Therefore an adjustment is provided that controls the direction of the emitted light. Although this device was described as allowing independent control over the segments a, b, c, d, e, or f, the segments may also be commonly controlled with fixed voltage or currents to create a desired luminance profile.

Each of the embodiments shown employ a common electro-luminescent layer, which will typically be used to emit white light. However, this layer can be patterned to include multiple electro-luminescent layers across the device, providing the ability to create segments that emit different colors of light. For example, a first electro-luminescent area emitter emits a first color of light and a second electro-luminescent area emitter emits a different color of light. Electro-luminescent area emitters, independently of the area illumination profile that is created, emit different colors of light.

Figure 10:
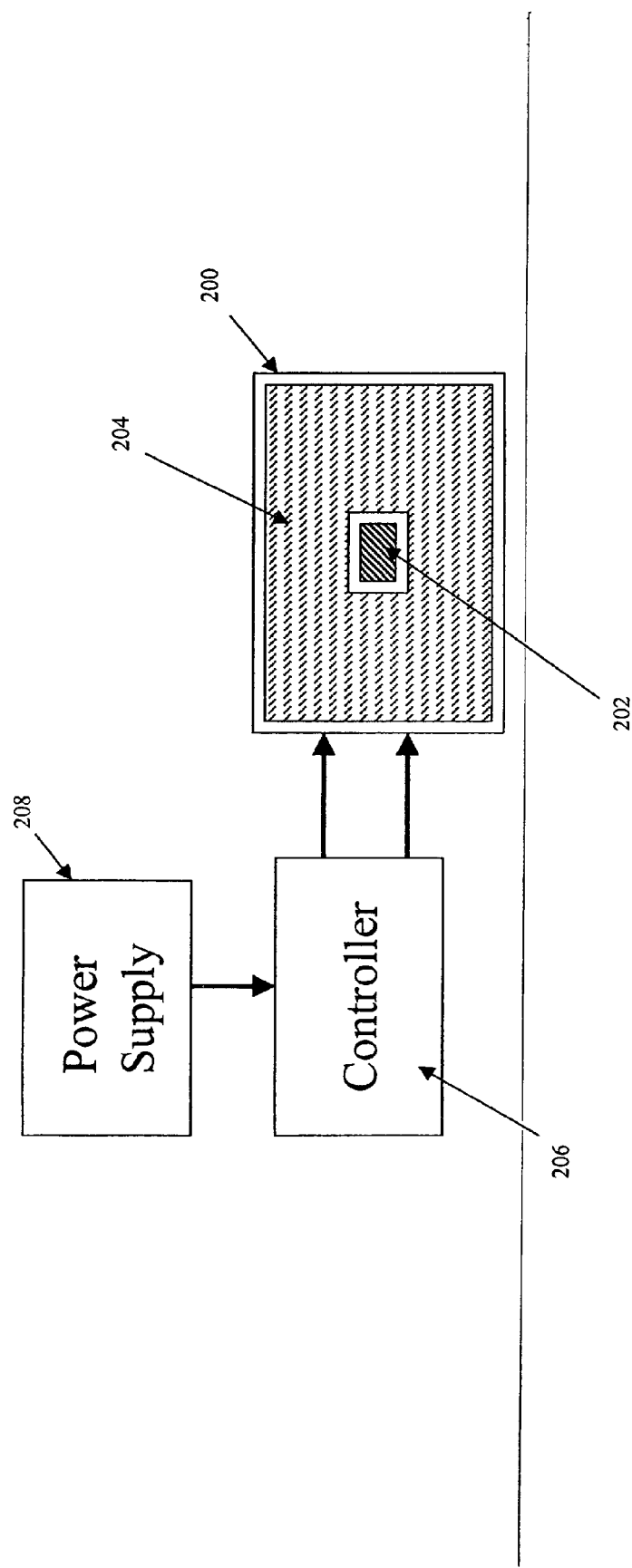
FIG. 10 illustrates a system according to an embodiment of the present invention.

The devices that have been disclosed herein may be employed in a system for illuminating an environment, which includes the components shown in FIG. 10. The necessary components include a substrate 200, two or more area emitters 202, 204 formed on the substrate 200, wherein each of the two or more area emitters emit light having different area illumination profiles; and a controller 206 for controlling the direction, illumination level or color of at least one of the two or more area emitters. This system will typically be capable of simultaneously providing a directed, narrow angle illumination and a wide-angle illumination. The system also includes a power supply 208. The controller 206 controls the amount or distribution of power from the power supply to the two or more area emitters. As discussed earlier, by providing different amounts of power to different electrode segments, which form the two or more area emitters, the controller 206 controls direction, illumination level or the color of light that is emitted by the device.

The electro-luminescent device can be any electro-luminescent device that can be used to form arrays of addressable light-emitting elements. These devices can include electro-luminescent layers 24 employing purely organic small-molecule or polymeric materials, typically including organic hole-transport, organic light-emitting and organic electron-transport layers as described in the prior art, including U.S. Pat. No. 4,769,292, issued Sep. 6, 1988 to Tang et al., and U.S. Pat. No. 5,061,569, issued Oct. 29, 1991 to VanSlyke et al. The electro-luminescent layer 24 can alternatively be formed from a combination of organic and inorganic materials, typically including organic hole-transport and electron-transport layers in combination with inorganic light-emitting layers, such as the light-emitting layers described in U.S. Pat. No. 6,861,155 issued Mar. 1, 2005 to Bawendi et al. Alternatively, the electro-luminescent layer 24 can be formed from fully inorganic materials such as the devices described in co-pending US Publication 2007/0057263 published 15 Mar. 2007, entitled "Quantum Dot Light Emitting Layer". In some embodiments of the present invention, the electro-luminescent layers include multiple organic dopants or sizes of quantum dots such that the electro-luminescent layer produces light that is perceived as white in color and that have a color-rendering index of 80 or higher. Such devices have been described in the art.

In one embodiment, the electro-luminescent device can incorporate a quantum dot inorganic light-emitting layer. In this device, the substrate 4 supports the electrodes 20, 22, 26 and electro-luminescent 24 layers; its only requirements are that it is sufficiently rigid to enable the deposition processes and that it can withstand any necessary thermal annealing processes (e.g. maximum temperatures of ~285° C.). Substrate 4 can be transparent or opaque. Possible substrate materials are glass, silicon, metal foils, and some plastics. The next deposited material will typically be one or more anodes 20, 22. For the case where substrate 4 is p-type Si, the anodes 20, 22 needs to be deposited on the bottom surface of substrate 4. A suitable anode metal for p-Si is Al. It can be deposited by thermal evaporation or sputtering. Following its deposition, it will preferably be annealed at ~430° C. for 20 minutes. For all of the other substrate types named above, the anodes 20, 22 are deposited on the top surface of substrate 4 and are comprised of a transparent conductor, for example, indium tin oxide (ITO). Sputtering or other well-known procedures in the art can deposit the ITO. The ITO is typically annealed at ~300° C. for 1 hour to improve its transparency. Because the sheet resistance of transparent conductors such as ITO are much greater than that of metals, bus metal can be selectively deposited through a shadow mask using thermal evaporation or sputtering to lower the voltage drop from the contact pads to the actual device. Next, inorganic light emitting layer 24 is deposited. It can be dropped or spin cast onto the transparent conductor (or Si substrate). Other deposition techniques, for example, inkjetting the quantum dot-inorganic nanoparticle dispersion is also possible. Following the deposition, the inorganic light-emitting layer 24 is annealed at a preferred temperature of 270° C. for 50 minutes. Lastly, a cathode 26 e.g., metal is deposited over inorganic light-emitting layer 24. Candidate cathode metals are ones that form an ohmic contact with the material comprising the inorganic nanoparticles in light-emitting layer 24. For example, in a case where the quantum dots are formed from ZnS inorganic nanoparticles, a preferred metal is Al. It can be deposited by thermal evaporation or sputtering, followed by a thermal anneal at 285° C. for 10 minutes. Although not shown in FIG. 5, a p-type transport layer and an n-type transport layer can be added to the device to surround the inorganic light-emitting layer 24. As is well known in the art, LED structures typically contain doped n- and p-type transport layers. They serve a few different purposes. Forming ohmic contacts to semiconductors is simpler if the semiconductors are doped. Since the light emitter layer is typically intrinsic or lightly doped, it is much simpler to make ohmic contacts to the doped transport layers. As a result of surface plasmon effects, having metal layers adjacent to light emitter layers results in a loss of emitter efficiency. Consequently, it is advantageous to space the light emitter layers from the metal contacts by sufficiently thick (at least 150 nm) transport layers. Finally, not only do the transport layers inject electron and holes into the light emitter layer, but by proper choice of materials, they can prevent the leakage of the carriers back out of the light emitter layer. For example, if the inorganic quantum dots in the light-emitting layer 24 were composed of $ZnS_{0.5}Se_{0.5}$ and the transport layers were composed of ZnS, then the electrons and holes would be confined to the light emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm.

Suitable materials for the n-type transport layer include II-VI and III-V semiconductors. Typical II-VI semiconductors are ZnSe or ZnS. As for the p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process. A more preferred route is to add the dopant in-situ during the chemical synthesis of the nanoparticle. Taking the example of ZnSe particles formed in a hexadecylamine (HDA)/TOPO coordinating solvent, the Zn source is diethylzinc in hexane and the Se source is Se powder dissolved in TOP (forms TOPSe). If the ZnSe were to be doped with Al, then a corresponding percentage (a few percent relative to the diethylzinc concentration) of trimethylaluminum in hexane would be added to the syringe containing TOP, TOPSe, and diethylzinc. In-situ doping processes like these have been successfully demonstrated when growing thin films by a chemical bath deposition. It should be noted the diode could also operate with only a p-type transport layer or an n-type transport layer added to the structure. Those skilled in the art can also infer that the layer composition can be inverted, such that, the cathode is deposited on substrate 4 and the anode is formed on the p-type transport layer. For the case of Si supports, substrate 4 is n-type Si.

Light-emitting layer 24 will preferably be comprised of several of light-emitting cores, each core having a semiconductor material that emits light in response to recombination of holes and electrons, each such light emitting core defining a first bandgap; a plurality of semiconductor shells formed respectively about the light emitting cores to form core/shell quantum dots, each such semiconductor shell having a second bandgap wider than the first bandgap; and a semiconductor matrix connected to the semiconductor shells to provide a conductive path through the semiconductor matrix and to each such semiconductor shell and its corresponding light-emitting core so as to permit the recombination of holes and electrons.

At least one of the two electrode layers (i.e., 20 and 22 or 26) will typically be formed of a transparent or semi-transparent material such as ITO or IZO. The opposing electrode will often be formed of a highly reflective material such as aluminum or silver, but may also be transparent. In a typical embodiment, the anode is transparent and the cathode is reflective but the opposing structure is also viable. Hole- and electron-transport materials can be formed from inorganic semi-conducting materials as described above, but are formed from organic semi-conducting materials. Additional layers may also be placed into the structure to promote other functions, such as electron and hole injection from the electrodes or electron or hole-blocking layers to prevent electrons or holes from traveling past the light-emitting layer to recombine with oppositely charged particles near one of the electrodes.

Some devices, constructed using inorganic quantum dots as described, have bandwidths of approximately 30 nm. Therefore, a variety of quantum dots are embedded, employing different materials or, preferably, different sizes in a device to construct a white light-emitting device. One or more quantum dots employing different materials, or preferably different sizes can be used to form other colors of light emission.

In electro-luminescent devices employing organic materials to form the electro-luminescent layer 24, this layer is typically formed from multiple sublayers, including a first optional hole-injecting layer, a first hole-transporting layer, a first light-emitting layer, and a first electron-transporting layer. Multiples of these groups of layers are formed with intervening connector layers to form the electro-luminescent layer 24. However, the total combined thickness of the organic layers forming an organic electro-luminescent layer 24 is preferably less than 500 nm.

Each of the layers of this device are further described for clarification.

Substrate

The OLED device of this invention is typically provided over a supporting substrate 4 where either of the of the electrode layers consisting of electrode segments 20 and 22 in FIG. 1 or of electrode 26 can be located near the substrate. The electrode near the substrate is conveniently referred to as the bottom electrode. The substrate can either be light-transmissive or opaque, depending on the intended direction of light emission. The light-transmissive property is desirable for viewing the EL emission through the substrate. Transparent glass or plastic is commonly employed in such cases. For applications where the EL emission is not viewed through the bottom electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course in these device configurations, the remaining electrode must be semi-transparent or transparent.

Electrodes

As shown in FIG. 1, the electrode layer 26 will be transparent or semi-transparent. For the electrodes that are transparent, various materials may be used in this invention, including indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used. For applications where EL emission is not viewed through one of the electrodes, the transmissive characteristics of the electrode are immaterial and any conductive material can be used, transparent, opaque or reflective. Example conductors for this application include, but are not limited to, gold, iridium, molybdenum, palladium, and platinum. Generally, the electrode layer formed from electrode segments 20 or 22 will be the anode. Typical anode materials, transmissive or otherwise, have a work function of 4.1 eV or greater.

Desirable materials for the electrodes that serve as a cathode should have good film-forming properties to ensure good contact with the underlying organic layer, promote electron injection at low voltage, and have good stability. Useful cathode materials often contain a low work function metal (<4.0 eV) or metal alloy. One preferred cathode material is comprised of an Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

Since the second electrode 26 will typically serve as the cathode, one would expect light emission to be viewed through this electrode. Therefore, the electrode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Electrode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layers (HIL)

It is often useful to provide hole-injecting layers between the electrode and the hole-transporting. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layers (HTL)

The hole-transporting layers contain at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl 4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layers (LEL)

As more fully described in U.S. Pat. Nos. 4,769,292 and 5,935,721, the light-emitting layers (LEL) will typically include a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. For the purposes of this invention, these dopants are alternately referred to as a species of emitter. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768, 292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)]
CO-2: Magnesium bisoxine[alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato)aluminum(III)
CO-5: Indium trisoxine[alias, tris(8-quinolinolato)indium]
CO-6: Aluminum tris(5-methyloxine) [alias, tris(5-methyl-8-quinolinolato) aluminum(III)]
CO-7: Lithium oxine[alias, (8-quinolinolato)lithium(I)]
CO-8: Gallium oxine[alias, tris(8-quinolinolato)gallium (III)]
CO-9: Zirconium oxine[alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2, 2',2"-(1,3,5-phenylene)tris [1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Many dopants are known that produce light with a dominant peak at one wavelength within the visible spectrum. Often the devices of the present invention require an OLED structure that is capable of creating light that has dominant peaks at two or more separate wavelengths in order to create the broadband emission that is necessary to practice the current invention. Such a light-emitting layer may be formed using two or more light emitting layers that are coated on top of another as discussed in co-pending U.S. application Ser. No. 10/990,865, which is herein included by reference. Each of these two or more light-emitting layers includes a first host material and a first light-emitting material. Placing more than one layer of light emitting material, each layer capable of producing light with a different peak wavelength within the structure, allows the construction of an EL structure to be formed that produces broadband emission. Further by adjusting the concentrations of the dopants used to create each peak wavelength, the relative height of each peak may be adjusted to form a spectral power distribution having the desired shape.

Electron-Transporting Layers (ETL)

Preferred thin film-forming materials for use in forming the electron-transporting layers of the EL units of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, the light-emitting layer and the electron transport layer can optionally be collapsed into a single layer that serve the function of supporting both light emission and electron transport. These layers can be collapsed in both small-molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method, (U.S. Pat. No. 6,066,357).

Tandem Layers

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the device, providing a polarizing medium over the device, or providing colored, neutral density, or color conversion filters over the device. Filters, polarizers, and anti-glare or anti-reflection coatings may be specifically provided over the cover or as part of the cover. In applications where a diffuse luminance is required, the top of the lamp may be coated with a scattering layer which is placed on the emitting side of the OLEDs, and if desired, also in the interstitial areas between the OLEDs. The scattering media may comprise small particles with a relatively high index of refraction that do not appreciably absorb the visible light from the OLED device. Such light scattering particles are titania, alumina, or zinc oxide particles, including Ti02. However, other particles, including BaITO3, SiO2, CaCO3, and BaSO4 may also be used. This layer may comprise a layer of packed light scattering particles or a carrier medium containing the light scattering particles. The carrier medium may be any appropriate medium; including glass or polymer materials, such as epoxy, silicone or urea resin.

Such light-scattering particles may also be located adjacent to any of the high-optical index layers (e.g. 20, 24, 26, 28) of the LED and employed to extract light trapped in an LED device by scattering light that is otherwise totally internally reflected in the high-optical index LED layers, thereby increasing the luminance of the LED. Such light-scattering layers are taught in commonly assigned U.S. patent application Ser. No. 11/065,082 entitled "OLED Device having Improved Output" by Cok et al and can be employed in the present invention.

The invention has been described in detail with particular reference to certain preferred embodiments thereof, but it will be understood that variations and modifications can be effected within the spirit and scope of the invention.

| PARTS LIST | |
|---|---|
| 2 | electro-luminescent area illumination device |
| 4 | substrate |
| 6 | first electro-luminescent area emitter |
| 8 | second electro-luminescent area emitter |
| 10 | cone angle of first electro-luminescent area emitter |
| 12 | cone angle of second electro-luminescent area emitter |
| 20 | first electrode segment |
| 22 | second electrode segment |
| 24 | electro-luminescent layer |
| 26 | second electrode |
| 28 | encapsulation layer |
| 30 | low index gap |
| 32 | first optical element |
| 34 | second substrate |
| 36 | flat surface |
| 38 | first illumination profile |
| 40 | optical layer |
| 50 | first electro-luminescent area emitter |
| 52 | first electro-luminescent area emitter |
| 54 | first electro-luminescent area emitter |
| 56 | first electro-luminescent area emitter |
| 58 | first electro-luminescent area emitter |
| 60 | second electro-luminescent area emitter |
| 62 | second electro-luminescent area emitter |
| 64 | second electro-luminescent area emitter |
| 66 | second electro-luminescent area emitter |
| 68 | second electro-luminescent area emitter |
| 80 | lens element |
| 82 | lens element |
| 84 | lens element |
| 86 | lens element |
| 88 | lens element |
| 90 | first electro-luminescent area emitter |
| 92 | first electro-luminescent area emitter |
| 94 | first electro-luminescent area emitter |
| 96 | first electro-luminescent area emitter |
| 98 | substrate |
| 100 | second electro-luminescent area emitter |
| 102 | second electro-luminescent area emitter |
| 104 | second electro-luminescent area emitter |
| 106 | second electro-luminescent area emitter |
| 110 | substrate |
| 112 | first electro-luminescent area emitter |
| 114 | second electro-luminescent area emitter |
| 116 | curved surface |
| 118 | first direction |
| 120 | second direction |
| 122 | bottom electrode segment |
| 124 | bottom electrode segment |
| 126 | common electrode layer |
| 128 | common electro-luminescent layer |
| 130 | third electrode segment |
| 132 | fourth electrode segment |
| 134 | fifth electrode segment |
| 136 | sixth electrode segment |
| 140 | portion |
| 142 | portion |
| 144 | portion |
| 146 | portion |
| 148 | portion |
| 148a | electrode segment a of portion 148 |
| 148b | electrode segment b of portion 148 |
| 148c | electrode segment c of portion 148 |

-continued

PARTS LIST

| | |
|---|---|
| 148d | electrode segment d of portion 148 |
| 148e | electrode segment e of portion 148 |
| 148f | electrode segment f of portion 148 |
| 152 | first optical element |
| 154 | first optical element |
| 156 | first optical element |
| 158 | first optical element |
| 160 | first optical element |
| 162 | voltage or current supply |
| 164 | voltage or current supply |
| 166 | voltage or current supply |
| 168 | voltage or current supply |
| 170 | voltage or current supply |
| 172 | voltage or current supply |
| 180 | luminance profile |
| 182 | luminance profile |
| 184 | luminance profile |
| 190 | luminance profile |
| 192 | shifted luminance profile |
| 200 | substrate |
| 202 | first area emitter |
| 204 | second area emitter |
| 206 | controller |
| 208 | power supply |

What is claimed is:

1. An electro-luminescent area illumination device, comprising:
a) a substrate;
b) two or more area emitters formed on the substrate, wherein each of the two or more area emitters emit light having different area illumination profiles and the different area illumination profiles comprise different cone angles for directing narrow-beam and wide-beam illumination;
c) wherein the two or more area emitters comprise respective two or more electrode segments that are formed on the substrate, each of the two or more electrode segments being reflective, an electro-luminescent layer formed over the two or more electrode segments, and an electrode formed over the electro-luminescent layer, the electrode being transparent; and
d) wherein the electro-luminescent area emitter with the narrow-beam profile is smaller than the electro-luminescent area emitter with the wide-beam profile.

2. The device according to claim 1, wherein one of the area emitters provides uniform illumination over a surface.

3. The device of claim 1, wherein the two or more area emitters include narrow-angle and wide-angle area emitters and the narrow-angle area emitters are distributed over the surface between the wide-angle area emitters or localized in one area.

4. The device of claim 1, wherein two or more of the area emitters are operated simultaneously.

5. The device of claim 1, wherein two or more of the area emitters are commonly controlled.

6. The device of claim 1, wherein the device provides multiple narrow angle illumination sources illuminating different areas.

7. The device of claim 1, wherein the two or more of the area emitters have a different intensity or color of illumination.

8. The device of claim 1, wherein two or more of the area emitters are independently adjustable.

9. The device of claim 8, wherein the adjustment controls the direction, illumination level or color of the emitted light.

10. The device according to claim 1, wherein the two or more area emitters are formed on the substrate are positioned so that a peripheral portion of one area emitter is enclosed by the other.

11. An electro-luminescent area illumination device, comprising:
a) a substrate;
b) a first electro-luminescent area emitter formed on the substrate in correspondence with first optical elements;
c) a first optical element that directs emitted light from the first electro-luminescent area emitter to shape a first illumination profile for directing narrow-beam illumination;
d) a flat optical element that allows emitted light from a second electro-luminescent area emitter formed on the substrate having a second illumination profile for directing wide-beam illumination;
e) wherein the first and second electro-luminescent area emitters comprise respective first and second electrode segments that are formed on the substrate, each of the first and second electrode segments being reflective, an electro-luminescent layer formed over the first and second electrode segments, and an electrode formed over the electro-luminescent layer, the electrode being transparent; and
f) wherein the first electro-luminescent area emitter is smaller than the second electro-luminescent area emitter.

12. The device according to claim 11, wherein the first optical element is separated from the first electro-luminescent area emitter by a low-index gap.

13. The device according to claim 11, wherein the first optical element is formed on a second substrate different from the substrate on which the first electro-luminescent area emitter is formed.

14. The device according to claim 11, wherein the first optical element is a lens or an array of lenses, or a reflective structure.

15. The device according to claim 11, wherein the first and second illumination profiles comprise different cone angles for providing narrow-beam and wide-beam illumination.

16. The device of claim 11, wherein the first electro-luminescent area emitter comprises linear segments and the first optical element is a one-dimensional lens or lens array for directing the emitted light in a narrow angle along one dimension.

17. The device of claim 11, wherein the electro-luminescent area emitters are independently controlled and are formed under one optical element.

18. The device of claim 11, wherein the two or more area emitters include narrow-angle and wide-angle area emitters and the narrow-angle area emitters are distributed over the surface between the wide-angle area emitters or localized in one area.

19. The device according to claim 11, wherein the two or more area emitters are formed on the substrate are positioned so that a peripheral portion of one area emitter is enclosed by the other.

20. A system for illuminating an environment comprising:
an electro-luminescent area illumination device, comprising:
a) a substrate;
b) two or more area emitters formed on the substrate, wherein each of the two or more area emitters emit light having different area illumination profiles and the different area illumination profiles comprise different cone angles for directing narrow-beam and wide-beam illumination;
c) a controller for controlling the direction, illumination level or color of at least one of the two or more area emitters to provide both a directed, narrow angle illumination and a wide angle illumination;
d) wherein the two or more area emitters comprise respective two or more electrode segments that are formed on the substrate, each of the two or more electrode segments being reflective, an electro-luminescent layer formed over the two or more electrode segments, and an electrode formed over the electro-luminescent layer, the electrode being transparent; and
e) wherein the electro-luminescent area emitter with the narrow-beam profile is smaller than the electro-luminescent area emitter with the wide-beam profile.

* * * * *